US005765835A

United States Patent [19]

Johnson

[11] Patent Number: 5,765,835

[45] Date of Patent: Jun. 16, 1998

[54] WAVEGUIDE SEAL ASSEMBLY

[76] Inventor: Ray M. Johnson, 22661 Hwy. 62, Shady Grove, Oreg. 97539

[21] Appl. No.: 953,539

[22] Filed: Sep. 28, 1992

[51] Int. Cl.[6] ........................ F16J 15/00

[52] U.S. Cl. ........................ 277/314; 277/602; 277/627; 277/637; 333/248; 333/254

[58] Field of Search ........................ 277/1, 198, 199, 277/207 A, 211, 235 B, 236, 901, 180; 29/888.3; 333/248, 254; 174/356 C; 439/920, 927

[56] References Cited

U.S. PATENT DOCUMENTS

| | | | |
|---|---|---|---|
| 2,955,857 | 10/1960 | Smith | 277/180 |
| 3,201,725 | 8/1965 | Johnson . | |
| 3,212,035 | 10/1965 | Skarpaas . | |
| 3,279,805 | 10/1966 | Quinson | 277/180 |
| 3,400,344 | 9/1968 | Booth | 333/254 |
| 3,704,021 | 11/1972 | Barbarin et al. | 277/198 |
| 4,932,673 | 6/1990 | Demnikov et al. | 277/901 |
| 5,076,592 | 12/1991 | Pearlstein | 297/180 |

FOREIGN PATENT DOCUMENTS

| | | | |
|---|---|---|---|
| 3404465 | 1/1986 | Germany | 333/254 |
| 0937707 | 9/1963 | United Kingdom | 277/180 |

*Primary Examiner*—Daniel G. DePumpo
*Attorney, Agent, or Firm*—Donald L. Beeson

[57] ABSTRACT

A waveguide seal assembly for a waveguide joint is fabricated in separate parts, including a relatively small inner conductive part for surrounding the coupled waveguide openings in the joined waveguide flanges of two joined waveguide sections, an outer conductive part having a central opening which permits the outer part to fit over the inner part such that an intermediate gap is formed between the inner and outer parts, and a gas sealing element, suitably in the form of an O-ring, fitted into this intermediatex gap. Preferably, an O-ring groove is provided on the outer perimeter of the inner conductive part for retaining the O-ring when the seal assembly is installed. Also, preferably the inner conductive part is slightly thicker than the outer part to ensure good electrical contact at the coupled waveguide openings.

12 Claims, 2 Drawing Sheets

33

41

39

31

29

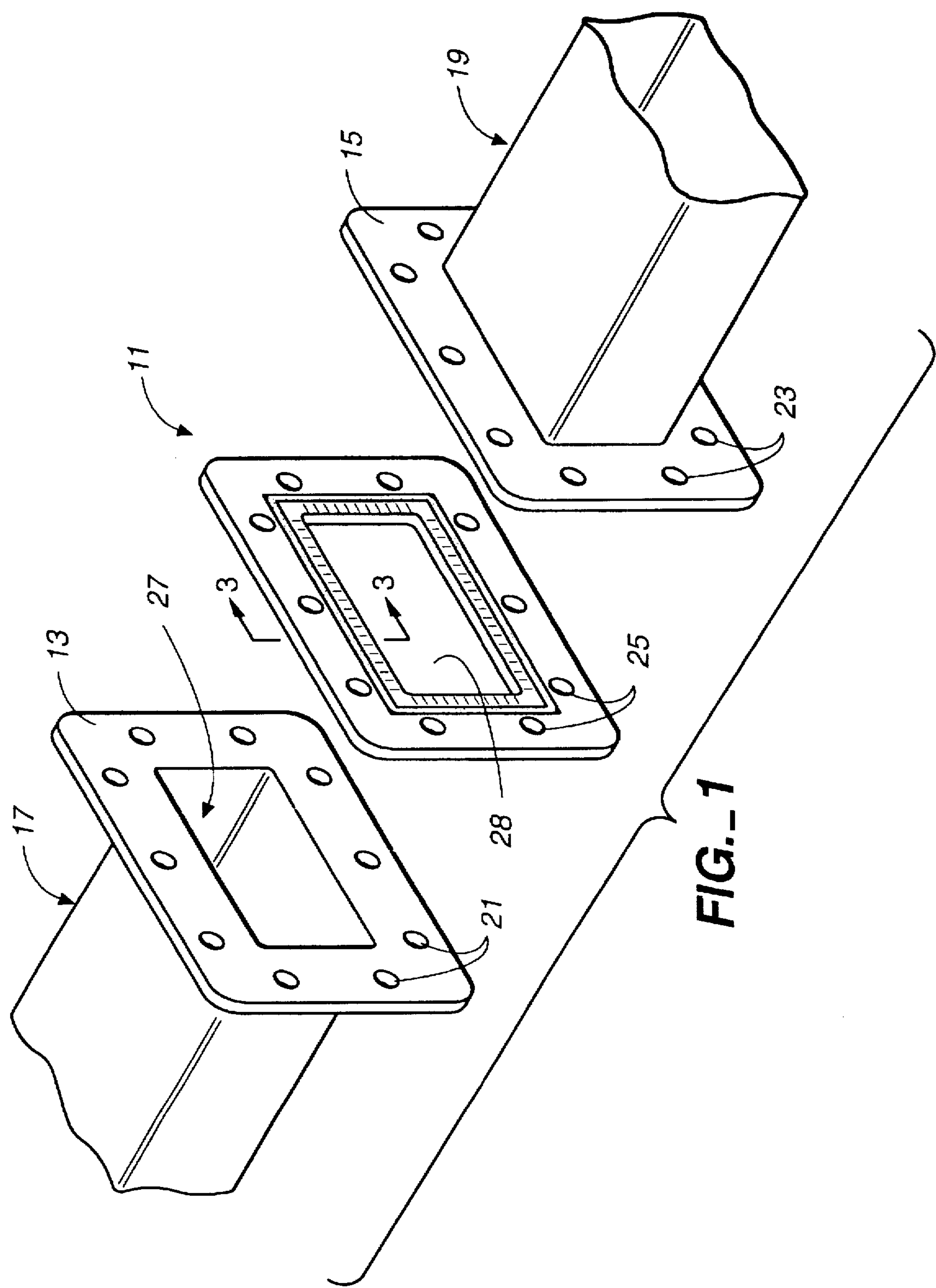
FIG._1

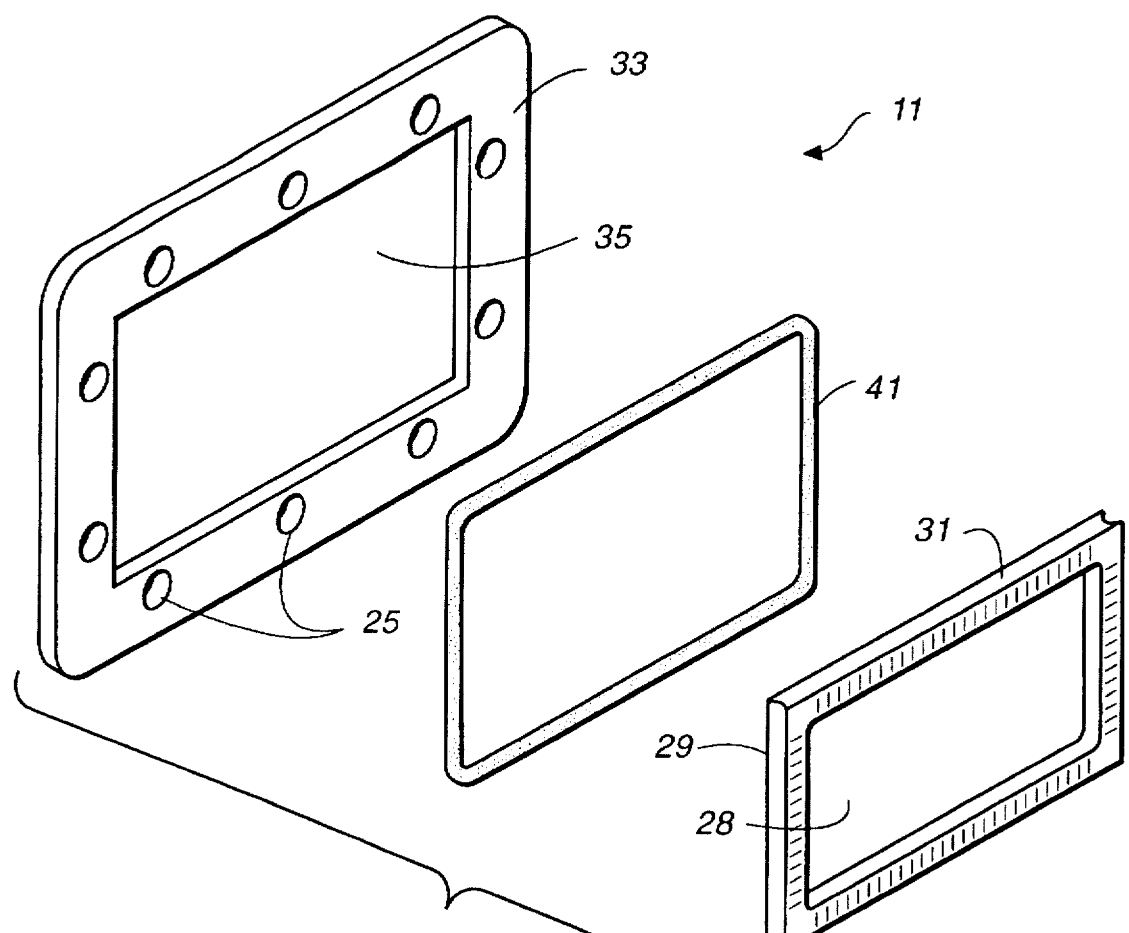
FIG._2
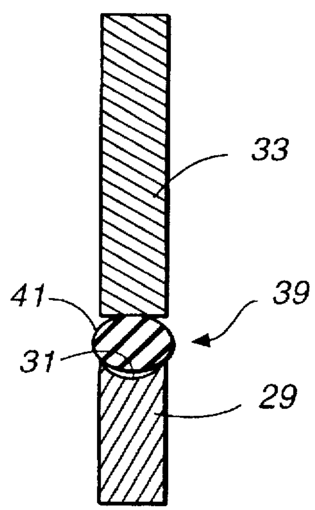
FIG._3
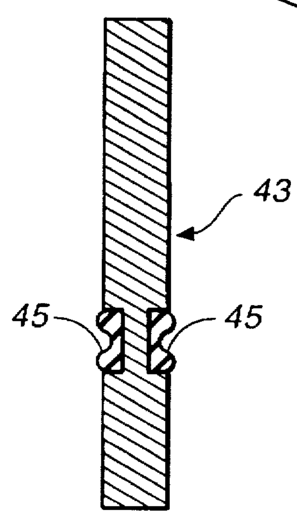
FIG._4
(PRIOR ART)

WAVEGUIDE SEAL ASSEMBLY

BACKGROUND OF THE INVENTION

The present invention generally relates to waveguide systems, and more particularly to pressure and vacuum seals for sealing the joints formed between interconnected sections of waveguide in vacuum and pressure applications.

In order to maintain a vacuum or positive gas pressure in a waveguide system, the joints between the flanges which terminate joined waveguide sections must be properly sealed, that is, the joint must be able to hold the pressure or vacuum and provide electrical continuity for the electromagnetic energy propagated through the waveguide. One known approach to sealing waveguide joints is to insert a metalized conducting O-ring into an O-ring groove machined directly into one of the waveguide flanges. Another approach is to provide a separate sealing element that fits between the waveguide flanges and that has sealing O-rings inserted into machined grooves in opposite faces of the seal. An example of this latter type of seal is a so-called "Parker seal" manufactured by the Parker Seal Group of Culver City, Calif. The advantage of the Parker seal, which is typically ⅛ inch thick in the direction of the waveguide axis, is that it can be used with flat CPR-type flanges without the requirement of having to machine O-ring grooves in the waveguide flanges. Parker seals are nonetheless relatively expensive due to the need to provide a separate sealing element around each of the faces of the seal. They are also typically fabricated of aluminum which is cadmium plated to reduce oxidation. The cadmium coating is a relatively poor conductor (as is aluminum) making the Parker seal ill-suited for high power applications because of the high $I^2R$ losses which would be generated in the seal.

The present invention provides a waveguide pressure seal assembly which, like a Parker-type seal, can be used with flat CPR flanges, but which also is more suitable for high power applications. The pressure seal of the invention has the additional advantage of being relatively inexpensive to manufacture. The invention eliminates the need to machine O-ring grooves in the faces of the seal, and permits the use of less expensive and relatively hard materials for the outer structure of the seal while providing a more conductive material, such as copper, at the walls of the coupled waveguides.

SUMMARY OF THE INVENTION

Briefly, the invention involves a waveguide seal assembly having an inner conductive part, suitably copper, and a separate outer part, suitably made of aluminum. The inner conductive part surrounds the coupled waveguide openings in the opposing waveguide flanges of a waveguide joint and provides a good conductive transition at the joint. The outer part, in turn, surrounds the inner conductive part. Specifically, the outer part has a central opening which is complimentary in shape to the outer perimeter of the inner part. This central opening is sized to fit over the inner part to form an intermediate gap between the two parts which can receive a gas sealing element, such as a separate silicone O-ring, or alternatively, an elastomeric material secured around the inner part. In the illustrated embodiment of the invention, the outer perimeter of the inner conductive part is provided with a shallow O-ring groove for retaining the separate O-ring around the inner part when the inner and outer parts are fitted together.

In the preferred embodiment, the inner conductive part is relatively small—in the nature of a narrow inner ring of material which is a relatively good conductor—and the outer part is relatively large. Also, the inner conductive part is preferably slightly thicker than the outer conductive part such that the waveguide flanges first make contact with the inner conductive part. This assures good electrical contact where needed, and eliminates the need to provide very flat machined surfaces on the outer part of the seal.

It is therefore seen that a primary object of the invention is to provide a waveguide seal assembly which can be manufactured relatively inexpensively, and which is also suitable for high power applications. Other objects of the invention will be apparent from the following specification and claims.

DESCRIPTION OF THE DRAWINGS

FIG. 1 is an exploded, perspective view of a waveguide joint using a waveguide seal assembly in accordance with the invention.

FIG. 2 is an exploded, perspective view of a disassembled three-part waveguide seal assembly in accordance with the invention.

FIG. 3 is a cross-sectional view of one side of an assembled waveguide seal assembly in accordance with the invention showing an O-ring fitted between the inner and outer parts of the seal.

FIG. 4 is a cross-sectional view of one side of a prior art waveguide seal showing the integral construction of the seal.

DETAILED DESCRIPTION OF THE ILLUSTRATED EMBODIMENT

Referring now to the drawings, FIG. 1 shows a rectangular waveguide seal assembly 11 in accordance with the invention which seals the waveguide joint formed between two conventional CPR waveguide flanges 13, 15 secured by suitable means, such as by soldering or braising, to the ends of two joined sections of waveguide 17, 19. The waveguide flanges and seal assembly lie in a plane perpendicular to the waveguide axis and have suitable matching bolt holes 21, 23, 25, distributed around their perimeter to permit the waveguide sections to be aligned and firmly bolted together. The resulting waveguide joint causes the rectangular waveguide openings (such as waveguide opening 27) presented at the waveguide flanges to be coupled together through the rectangular opening 28 in the seal assembly and provides an electrically continuous path for microwave currents generated on the interior walls of the waveguide.

FIGS. 2 and 3 illustrate the unique construction of the waveguide seal assembly 11 shown in FIG. 1. Specifically, the seal assembly is fabricated in separate and separable parts which include an inner part 29, an outer part 33, and an elastomeric sealing element 41. The inner part 29 is seen to be a narrow rectangular ring which has a defined outer perimeter 31 and which is sized and shaped to surround the coupled waveguide openings in the waveguide flanges 13, 15. The outer part 33, in turn, has a central opening 35 which is complimentary in shape to the outer perimeter 31 of the inner part. This central opening is sized to permit the outer part to fit over the inner part so as to leave a intermediate gap 39 between the two parts. The intermediate gap 39 is sized to accommodate elastomeric sealing element 41 which, when fitted into the gap, acts to hold the inner and outer parts together as a unitary assembly, and which provides a pressure or vacuum seal at the waveguide joint along the outer perimeter of the inner part of the assembly. This multipart construction contrasts with the unitary construction of the prior art seal 43 illustrated in FIG. 4 which is provided with sealing elements 45 in grooves machined on the opposite faces of the seal.

The sealing element of the present invention is preferably in the form of a silicone O-ring that is pre-shaped to fit around the perimeter 31 of the inner part 29 of the seal. Rectangular O-rings, for example, would be commercially available for use with a rectangular inner part such as illustrated in the drawings. It is understood, however, that a circular O-ring and rectangular part could be used together by stretching the O-ring to fit. The O-ring should nevertheless be large enough to provide a pressure seal at the flange surfaces. Thus, the O-ring will have a diameter slightly larger than the greatest thickness of the inner and outer parts of the seal assembly.

A shallow O-ring groove is preferably formed around the outer perimeter 31 of the inner part as shown in FIG. 2. This groove acts to capture the O-ring and hold it in place as the parts of the seal are assembled.

As an alternative to using a separate O-ring as a sealing element, the sealing element may be in the form of an elastomeric material, such as Buna rubber, attached directly to the perimeter 31 of the inner part 29. The sealing element can be attached by a suitable adhesive or by mechanical means such as pins inserted into, but preferably not through the inner part.

The relative sizing of the inner and outer parts of the seal assembly are important. First, the inner part 29 of the seal will preferably have a thickness that is slightly larger than the nominal thickness of the outer part 33. This will eliminate the need to machine the outer part to ensure that the inner part fully contacts the waveguide flanges when the flanges are clamped over the seal. Also, the inner part is preferably relatively small compared to the outer part with the inner part providing electrical contact at the waveguide joint and the outer part providing structural mass to the seal which holds the sealing O-ring in place. The inner and outer parts can be made of different materials and, for the most part, fabricated from standard sheet stock using a punching or stamping process. (The O-ring groove will be machined as mentioned below.) As above noted, the inner part will be fabricated of a highly conductive material, typically copper, while the outer part can be fabricated of a less expensive, lightweight material such as aluminum.

It is found that the seal assembly of the invention for a 284 CPR flange can suitably have an inner part fabricated of a 0.125 inch thick OHFC Copper, an outer part fabricated from nominal 0.120 inch thick aluminum, and a silicone O-ring having a cross-sectional diameter in the order of 0.135 inches to 0.140 inches. A suitable O-ring groove can be made in the inner part perimeter by an one-eighth inch diameter ball end mill milled to a 0.030 inch depth.

It shall be appreciated that the facing surfaces of the inner part of the seal assembly can be knurled, as illustrated in FIG. 2, such that, when the surfaces contact the flange faces, they dig into the faces to provide a low resistance RF joint. Alternatively, the faces of the inner part could have a deeper knife-edge pattern. The knife-edges would ensure good metal to metal contact at the seal surface, even when irregular faces are present on the outer part of the seal. Also, in the process of using a ball end mill or concave cutter to machine a shallow O-ring groove in an inner part made of copper, the copper material at the edges of the groove can be made to flare out. Such flared edges can advantageously provide an edge contact which compensates for uneven surfaces on the flat flanges covering the seal.

To use the illustrated seal assembly of the invention, the rectangular O-ring 41 is first simply placed over the inner part 29 such that it is retained in the O-ring groove that extends around the outer perimeter 31 of the inner part. The outer part 33 can then be placed over the inner part such that the inner part and surrounding O-ring are retained by frictional forces in the central opening 35 of the outer part. The assembly of the inner and outer parts and the O-ring can thereafter be inserted between flanges 13, 15 of the two waveguide sections 17, 19 as illustrated in FIG. 1. The alignment of the bolt holes of the outer part of the seal with the flanges bolt holes will act to align the seal on the waveguide axis while the clamping forces of the waveguide flanges will act hold the seal's assembled parts together.

Therefore, it can be seen that the present invention provides a seal assembly for a waveguide joint that can be relatively inexpensively manufactured, that provides good electrical contact at the coupled waveguide openings, and that efficiently seals the waveguide joint. Although the present invention has been described in considerable detail in the foregoing specification, it is understood that it is not intended that the invention be limited to such detail, except as may be necessitated by the following claims.

What I claim is:

1. A waveguide seal assembly for sealing a waveguide joint wherein said waveguide joint is formed between two joined waveguide flanges having coupled waveguide openings, said waveguide seal assembly comprising an inner conductive part sized and shaped to substantially mate with the coupled waveguide openings presented at the joined waveguide flanges so as to provide a continuous electrical path across the waveguide joint, said inner conductive part having a defined outer perimeter, an outer part separable from said inner part, said outer part having a central opening which is complimentary in shape to the outer perimeter of said inner part, the central opening of said outer part being larger than the perimeter of said inner part such that, when said inner part is placed within said central opening, an intermediate gap separates said inner and outer parts, and a gas sealing element sized to removably fit in the intermediate gap separating said inner and outer parts for providing a pressure seal at the waveguide joint when the waveguide seal assembly formed by the fitting together of said inner and outer parts and said gas sealing element is clamped between the waveguide flanges forming the waveguide joint, said inner conductive part being slightly thicker than said outer part such that said inner part is first contacted by waveguide flanges forming the waveguide joint.

2. The waveguide seal assembly of claim 1 wherein said gas sealing element is an O-ring.

3. The waveguide seal assembly of claim 2 wherein an O-ring groove is formed on the outer perimeter of said inner part for retaining said O-ring to the outer perimeter of said inner part when said inner and outer parts are fitted together.

4. The waveguide seal assembly of claim 1 wherein said inner conductive part is smaller than said outer part such that the inner part constitutes a relatively small portion of the seal assembly.

5. A waveguide seal assembly for sealing a waveguide joint wherein said waveguide joint is formed between two joined waveguide flanges having coupled waveguide openings, said waveguide seal assembly comprising an inner conductive part sized and shaped to substantially mate with the coupled waveguide openings presented at the joined waveguide flanges so as to provide a continuous electrical path across the waveguide joint, said inner conductive part having a defined outer perimeter and knurled facing surfaces for enhancing the electrical contact between said inner conductive part and the waveguide flanges forming the waveguide joint, an outer part separable from said inner part, said outer part having a central opening which is complimentary in shape to the outer perimeter of said inner part, the central opening of said outer part being larger than the perimeter of said inner part such that, when said inner part is placed within said central opening, an intermediate gap separates said inner and outer parts, and a gas sealing element sized to removably fit in the intermediate gap separating said inner and outer parts for providing a pressure seal at the waveguide joint when the waveguide seal assembly formed by the fitting together of said inner and outer parts and said gas sealing element is clamped between the waveguide flanges forming the waveguide joint.

6. A waveguide seal assembly for sealing a waveguide joint wherein said waveguide joint is formed between two joined waveguide flanges having coupled waveguide openings, said waveguide seal assembly comprising a copper inner conductive part sized and shaped to substantially mate with the coupled waveguide openings presented at the joined waveguide flanges so as to provide a continuous electrical path across the waveguide joint, said inner conductive part having a defined outer perimeter, an aluminum outer part separable from said inner part, said outer part having a central opening which is complimentary in shape to the outer perimeter of said inner part, the central opening of said outer part being larger than the perimeter of said inner part such that, when said inner part is placed within said central opening, an intermediate gap separates said inner and outer parts, and a gas sealing element sized to removably fit in the intermediate gap separating said inner and outer parts for providing a pressure seal at the waveguide joint when the waveguide seal assembly formed by the fitting together of said inner and outer parts and said gas sealing element is clamped between the waveguide flanges forming the waveguide joint.

7. A waveguide seal assembly for sealing a waveguide joint wherein said waveguide joint is formed between two joined waveguide flanges having coupled waveguide openings, said waveguide seal assembly comprising an inner conductive part sized and shaped to substantially mate with the coupled waveguide openings presented at the joined waveguide flanges so as to provide a continuous electrical path across the waveguide joint, said inner conductive part having a defined outer perimeter, an outer part separable from said inner part, said outer part having a central opening which is complimentary in shape to the outer perimeter of said inner part, the central opening of said outer part being larger than the perimeter of said inner part such that, when said inner part is placed within said central opening, an intermediate gap separates said inner and outer parts, and said outer part further including bolt holes which align with corresponding bolt holes provided in the waveguide flanges forming the waveguide joint, and a gas sealing element sized to removably fit in the intermediate gap separating said inner and outer parts for providing a pressure seal at the waveguide joint when the waveguide seal assembly formed by the fitting together of said inner and outer parts and said gas sealing element is clamped between the waveguide flanges forming the waveguide joint.

8. A waveguide seal assembly for sealing a waveguide joint wherein said waveguide joint is formed between two joined waveguide flanges having coupled waveguide openings, said waveguide seal assembly comprising an inner conductive part sized and shaped to substantially mate with the coupled waveguide openings presented at the joined waveguide flanges so as to provide a continuous electrical path across the waveguide joint, said inner conductive part having a defined outer perimeter, an outer part separable from said inner part, said outer part having a central opening which is complimentary in shape to the outer perimeter of said inner part, the central opening of said outer part being larger than the perimeter of said inner part such that, when said inner part is placed within said central opening, an intermediate gap separates said inner and outer parts, and a gas sealing element physically attached to the outer perimeter of said inner part and sized to removably fit in the intermediate gap separating said inner and outer parts for providing a pressure seal at the waveguide joint when the waveguide seal assembly formed by the fitting together of said inner part and said outer part with said attached gas sealing element is clamped between the waveguide flanges forming the waveguide joint.

9. A method of sealing a waveguide joint formed between the flanges of two waveguide sections, comprising the steps of surrounding the waveguide openings presented at the waveguide flanges with an inner conductive part, surrounding said inner conductive part with a larger outer part which is separable from said inner part so as to form an intermediate gap between said inner and outer parts, and removably fitting a sealing element in the intermediate gap between said separate inner and outer parts whereby a pressure seal is provided at the waveguide joint when the assembly of said inner and outer parts and said sealing element is clamped between waveguide flanges forming the waveguide joint.

10. The method of claim 9 wherein said inner part is fabricated of copper and said outer part is fabricated of aluminum.

11. The method of claim 9 wherein said inner part is slightly thicker than said outer part such that said inner part is first contacted by the waveguide flanges which form the waveguide joint.

12. A waveguide seal assembly for sealing a waveguide joint wherein said waveguide joint is formed between two joined waveguide flanges having coupled waveguide openings, said waveguide seal assembly comprising an inner conductive part sized and shaped to substantially mate with the coupled waveguide openings presented at said joined waveguide flanges so as to provide a continuous electrical path across said waveguide joint, said inner conductive part having a defined outer perimeter and an O-ring groove formed in said outer perimeter, an outer part separable from said inner part, said outer part having a central opening which is complimentary in shape to the outer perimeter of said inner part and which is sized to permit said inner part to fit within said opening such that an intermediate gap is formed between said inner and outer parts, said inner part being substantially smaller and of a relatively more conductive material than said outer part, and a gas sealing O-ring sized to removably fit in the intermediate gap between said inner and outer parts for providing a pressure seal at the waveguide joint along the outer perimeter of said inner part when the waveguide seal assembly is clamped between the waveguide flanges forming the waveguide joint, said O-ring being retained in the O-ring groove of said inner part when said inner and outer parts are fitted together, said waveguide seal assembly being sized to occupy substantially the entire region between the waveguide flanges.

* * * * *